US008610406B2

(12) United States Patent
Ladurner et al.

(10) Patent No.: US 8,610,406 B2
(45) Date of Patent: Dec. 17, 2013

(54) SYSTEM AND METHOD FOR TEMPERATURE BASED CONTROL OF A POWER SEMICONDUCTOR CIRCUIT

(75) Inventors: Markus Ladurner, Villach (AT); Robert Illing, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/479,753

(22) Filed: May 24, 2012

(65) Prior Publication Data

US 2012/0229193 A1    Sep. 13, 2012

Related U.S. Application Data

(63) Continuation of application No. 12/242,266, filed on Sep. 30, 2008, now Pat. No. 8,203,315.

(51) Int. Cl.
*H02J 7/04*    (2006.01)
*H02J 7/16*    (2006.01)

(52) U.S. Cl.
USPC ........................................................ 320/150

(58) Field of Classification Search
USPC ........................................................ 327/512
See application file for complete search history.

(56) References Cited

U.S. PATENT DOCUMENTS

| | | | |
|---|---|---|---|
| 4,255,961 A * | 3/1981 | Biltonen et al. | 374/11 |
| 5,946,181 A * | 8/1999 | Gibson | 361/103 |
| 6,144,085 A | 11/2000 | Barker | |
| 6,628,491 B1 | 9/2003 | Tihanyi et al. | |
| 7,672,106 B1 | 3/2010 | Sullivan | |
| 2004/0070910 A1 | 4/2004 | Gergintschew | |
| 2006/0197581 A1 * | 9/2006 | Chun et al. | 327/512 |
| 2007/0058310 A1 | 3/2007 | Fan et al. | |
| 2007/0110123 A1 * | 5/2007 | Nam et al. | 374/170 |
| 2008/0043393 A1 | 2/2008 | Petkov | |
| 2008/0265822 A1 | 10/2008 | Menegoli et al. | |

OTHER PUBLICATIONS

Letor, R., et al., "Life time prediction and design for reliability of Smart Power devices for automotive exterior lighting," 5th International Conference on Integrated Power Electronics Systems, Mar. 11-13, 2008, 5 pages, VDE Verlag GMBH, Berlin-Offenbach.

* cited by examiner

*Primary Examiner* — Arun Williams
(74) *Attorney, Agent, or Firm* — Slater & Matsil, L.L.P.

(57) ABSTRACT

In a method for operating a power semiconductor circuit a power semiconductor chip is provided which includes a power semiconductor switch with a first load terminal and with a second load terminal. Further, a first temperature sensor which is thermally coupled to the power semiconductor switch and a second temperature sensor are provided. The power semiconductor switch is switched OFF or kept switched OFF if the temperature difference between a first temperature of the first temperature sensor and a second temperature of the second temperature sensor is greater than or equal to a switching-OFF threshold temperature difference which depends, following an inconstant first function, on the voltage drop across the power semiconductor switch between the first load terminal and the second load terminal.

26 Claims, 4 Drawing Sheets

SYSTEM AND METHOD FOR TEMPERATURE BASED CONTROL OF A POWER SEMICONDUCTOR CIRCUIT

This application is a continuation of U.S. application Ser. No. 12/242,266 entitled, "System and Method for Temperature Based Control of a Power Semiconductor Circuit" which was filed on Sep. 30, 2008 and is incorporated herein by reference in its entirety.

TECHNICAL FIELD

The invention relates to power semiconductor circuits.

BACKGROUND

Power semiconductor circuits are used, inter alia, to provide electrical loads with electrical power. For this purpose, the power semiconductor circuit comprises at least one controllable power semiconductor switch. As such a power semiconductor switch produces waste heat, there is a danger of overheating the power semiconductor switch. Hence, there is a need for an effective protection concept.

SUMMARY OF THE INVENTION

A method for operating a power semiconductor circuit arrangement is provided. In the method, a power semiconductor chip is provided which comprises a power semiconductor switch with a first load terminal and with a second load terminal. Then, a first temperature sensor which is thermally coupled to the power semiconductor switch and a second temperature sensor are provided. The power semiconductor switch is switched OFF or kept switch switched OFF if the temperature difference between a first temperature of the first temperature sensor and a second temperature of the second temperature sensor is greater than or equal to a switching-OFF threshold temperature difference which depends, following an inconstant first function, on the voltage drop across the power semiconductor switch between the first load terminal and the second load terminal.

Further, a power semiconductor circuit arrangement is provided. The power semiconductor circuit arrangement includes a power semiconductor chip, a first temperature sensor, and a second temperature sensor. The power semiconductor chip comprises a power semiconductor switch with a first load terminal and with a second load terminal. The first temperature sensor is thermally coupled to the power semiconductor switch. The power semiconductor circuit arrangement further comprises an electrical circuit which is designed to switch OFF the power semiconductor switch or to keep the power semiconductor switch switched OFF if the temperature difference between a first temperature of the first temperature sensor and a second temperature of the second temperature sensor is greater than or equal to a switching-OFF threshold temperature difference which depends, following an inconstant first function, on the voltage drop across the power semiconductor switch between the first load terminal and the second load terminal.

Then, a power semiconductor circuit arrangement is provided. The power semiconductor circuit arrangement includes a power semiconductor chip, a first temperature sensor, and a second temperature sensor. The power semiconductor chip comprises a power semiconductor switch with a first load terminal, a second load terminal, and a control input terminal. The first temperature sensor is thermally coupled to the power semiconductor switch. The arrangement further includes a temperature difference evaluation unit, a threshold providing unit, and a comparator unit. The temperature difference evaluation unit is designed to provide a first voltage at a first output, the first voltage representing the temperature difference between the temperature of the first temperature sensor and the temperature of the second temperature sensor. The threshold providing unit is designed to provide a second voltage at a second output, the second voltage representing a switching-OFF threshold temperature difference from an inconstant first function at a voltage difference measured between the first load terminal and the second load terminal, wherein the first function is a switching-OFF threshold temperature difference depending on a voltage drop. The comparator unit comprises a first comparator input, a second comparator input, and a comparator output, wherein the first output is electrically connected to the first comparator input, wherein the second output is electrically connected to the second comparator input, and wherein the comparator output is electrically connected to the control input of the power semiconductor switch. The comparator unit is designed to provide a signal causing the power semiconductor switch to remain or to be switched in the OFF-state, if the voltage difference between the first voltage and the second voltage implies that a temperature difference determined by the temperature difference evaluation unit is greater than or equal to a switching-OFF threshold temperature difference determined by the first threshold providing unit.

BRIEF DESCRIPTION OF THE DRAWINGS

The accompanying drawings are included to provide a further understanding of examples and are incorporated in and constitute a part of this specification. The drawings illustrate examples of the invention and together with the description serve to explain principles of the invention. Other examples and many of the intended advantages of examples will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part hereof, and in which is shown by way of illustration specific examples in which the invention may be practiced. In this regard, directional terminology, such as "top," "bottom," "front," "back," "leading," "trailing," etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary examples described herein may be combined with each other, unless specifically noted otherwise.

Figure 1:
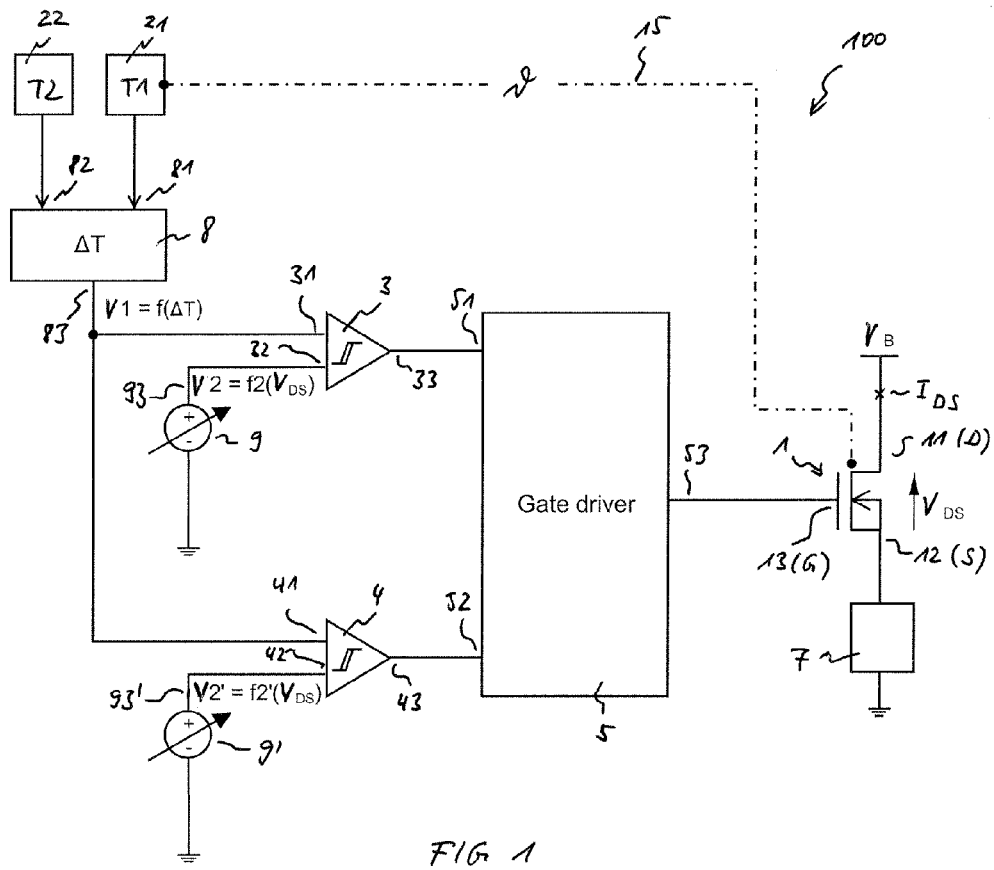
FIG. 1 is a simplified circuit diagram of a power semiconductor circuit arrangement.

FIG. 1 is a simplified circuit diagram of a power semiconductor circuit arrangement 100. The arrangement 100 comprises a power semiconductor switch 1 with a first load terminal 11, a second load terminal 12, and a control input 13. The power semiconductor switch 1 may be any controllable power semiconductor switch, e.g., a MOSFET, DMOS transistor, a VMOS transistor, an IGBT, a JFET, a bipolar transistor, a thyristor, e.g., a GTO (GTO=gate turn off thyristor), etc. Depending on the selected type of the controllable power semiconductor switch 1, the pair of load terminals 11/12 may be drain/source or source/drain or emitter/collector or collector/emitter or anode/cathode or cathode/anode. The control input 13 may be a gate electrode or a base electrode, or, in case of a light triggered power semiconductor switch, an optically sensitive area of the switch.

In the present example, the power semiconductor switch 1 is a DMOS transistor. An arbitrary electrical load 7, for example, an incandescent lamp, a motor, etc. is connected in series with the power semiconductor switch 1 and connected to the second load terminal 12. Alternatively, the electrical load 7 could also be connected to the first load terminal 11.

In order to provide electrical energy to the load 7, a power supply voltage $V_B$ is applied to the series connection of the power semiconductor switch 1 and the load 7. For example, the supply voltage $V_B$ may be a battery voltage in automotive applications, or a DC-link voltage (DC-link=direct current link) in power conversion applications.

In the ON-state of the power semiconductor switch 1, an electric current $I_{DS}$ flows through the power semiconductor switch 1 and the load 7. Otherwise, in the OFF-state of the power semiconductor switch 1, apart from an insignificant leakage current, there is no current flowing through the power semiconductor switch 1.

Further, a gate driving unit 5 is provided so as to control the power semiconductor switch 1, i.e., the gate driving unit 5 is designed to switch the power semiconductor switch 1 from the ON-state to the OFF-state, or vice versa. To this, the gate driving unit 5 comprises an output 53 which is electrically connected to the control input 13 of the power semiconductor switch 1.

If the power semiconductor switch 1 is switched ON, the temperature T1 of the power semiconductor switch 1 which is referred to as "first temperature" will increase due to the power loss of the switch 1. The temperature T1 depends in particular on the current $I_{DS}$ through the power semiconductor switch 1, on the power-ON time of the power semiconductor switch 1, and on the resistance of the power semiconductor switch 1 in the ON-state ($R_{ON}$).

In order to avoid overheating the power semiconductor switch 1, a first temperature sensor 21, which is thermally coupled to the power semiconductor switch 1, is provided. In FIG. 1, the thermal coupling is symbolized by a dashed line 15 between the power semiconductor switch 1 and the first temperature sensor 21. For example, the first temperature sensor 21 may be integrated in the power semiconductor chip close to the power semiconductor switch 1.

Then, a second temperature sensor 22 is arranged distant from the first temperature sensor 21. For example, the second temperature sensor 22 may also be integrated in the same power semiconductor chip as the power semiconductor switch 1, but distant therefrom so as to measure a temperature different from the temperature of the power semiconductor switch 1. Alternatively, it is possible to arrange the second temperature sensor 22 at a location outside the semiconductor chip. In the sense of any of the above described possibilities, the second temperature sensor 22 is regarded to be thermally decoupled from the power semiconductor chip 1, and therefore will have a second temperature T2 which is different from the first temperature T1. In many applications addressed by the present invention, the first temperature T1 will, at least temporarily, be higher than or equal to the second temperature T2, i.e. a temperature difference $\Delta T=T1-T2$ will be greater than or equal to zero.

In FIG. 1, a temperature difference evaluation unit 8 determines the temperature difference $\Delta T=T1-T2$. In this sense, "determine" may, but does not necessarily mean, that the temperature difference evaluation unit 8 provides a temperature difference $\Delta T$ which may be expressed in units like "K" (Kelvin), "° C." (degrees centigrade) or "° F." (degrees Fahrenheit). Generally, it is sufficient if the temperature difference evaluation unit 8 provides a first signal which is a measure for the temperature difference $\Delta T$. For example, the first signal may be an electric current, or, as exemplary shown in FIG. 1, an electric voltage V1 representing a difference between signals 81 and 82 from temperature sensors 22 and 21, respectively. In other words, the provided first signal is a function $f(\Delta T)$ depending on the temperature difference $\Delta T$.

In FIG. 1, the first signal is provided at an output 83 of the temperature difference evaluation unit 8 and fed to a first input 31 of a first comparator unit 3. The first comparator unit 3 further comprises a second input 32 which is electrically connected to an output 93 of a first threshold providing unit 9 in order to receive a second signal generated by the first threshold providing unit 9. The second signal may be, for example, an electric current, or, as exemplary shown in FIG. 1, an electric voltage V2. The second signal is an inconstant function $f2(V_{DS})$ of the voltage drop $V_{DS}$ across the power semiconductor chip 1, i.e., of the voltage $V_{DS}$ between the first load terminal 11 and the second load terminal 12, and represents a predefined switching-OFF threshold temperature difference $\Delta T_{OFF}$ in order to provide for switching OFF the power semiconductor chip 1 or to keep the power semiconductor chip 1 in the OFF-state, if the temperature difference $\Delta T=T1-T2$ is greater than or equal to the threshold temperature difference $\Delta T_{OFF}$.

Figure 3A:
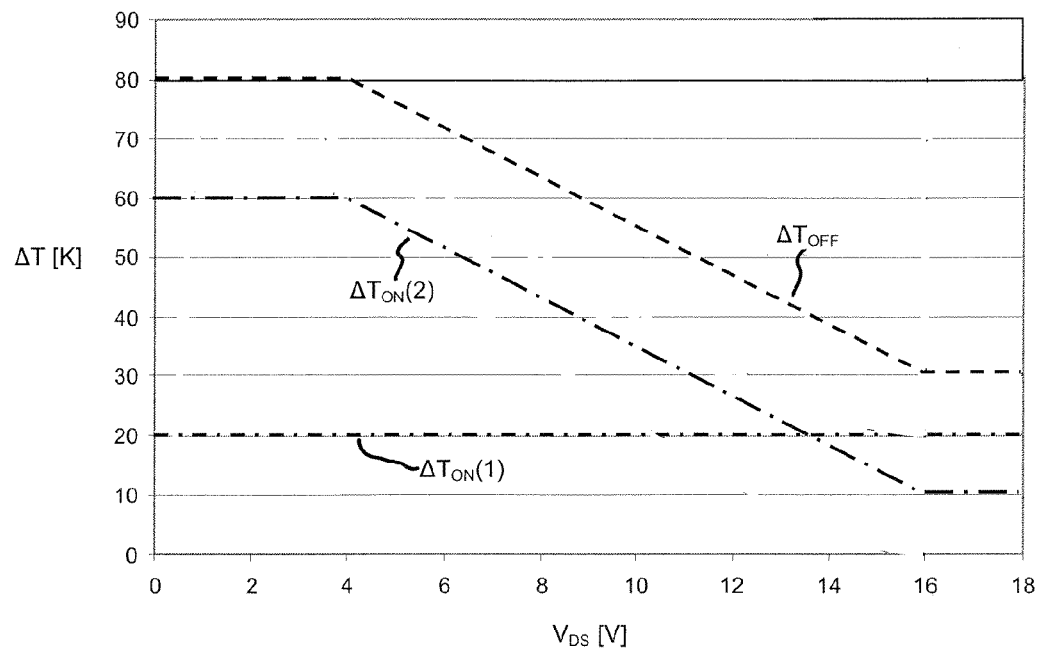
FIG. 3A is a diagram showing possible shapes of a switching-OFF threshold temperature difference curve and of two different switching-ON threshold temperature difference curves.

FIG. 3A shows a possible shape of a switching-OFF threshold temperature difference curve $\Delta T_{OFF}$, and of two possible switching-ON threshold temperature difference curves $\Delta T_{ON}(1)$ and $\Delta T_{ON}(2)$, each curve depending on the voltage drop $V_{DS}$ across the power semiconductor chip 1 as described above with reference to FIG. 1. As shown in the example of FIG. 3A, the switching-OFF threshold temperature difference curve $\Delta T_{OFF}$ is inconstant and may comprise, e.g., an optional constant section (in the example in a range from $V_{DS}$=0V to 4V), an optional linear falling section (in the example in a range from $V_{DS}$=4 V to 16 V), and an optional constant section (in the example in a range above $V_{DS}$=16V). In other examples, the switching-OFF threshold temperature difference curve $\Delta T_{OFF}$ may also be curved.

The switching-ON threshold temperature difference curve $\Delta T_{ON}(2)$ does not exceed the switching-OFF threshold temperature difference curve $\Delta T_{OFF}$. The switching-ON threshold temperature difference curve $\Delta T_{ON}(2)$ may, e.g., also have an optional constant section (in the example in a range from $V_{DS}$=0V to 4V), an optional linear falling section (in the example in a range from $V_{DS}$=4 V to 16 V), and an optional constant section (in the example in a range above $V_{DS}$=16V). In the example of FIG. 3A, the difference between the switching-OFF threshold temperature difference curve $\Delta T_{OFF}$ and the switching-ON threshold temperature difference curve $\Delta T_{ON}(2)$ is constant over the whole range of $V_{DS}$. In the example, the difference is about 20 K.

An other example for a possible switching-ON threshold temperature difference curve is curve $\Delta T_{ON}(1)$ which is constant over the whole range of $V_{DS}$.

Figure 3B:
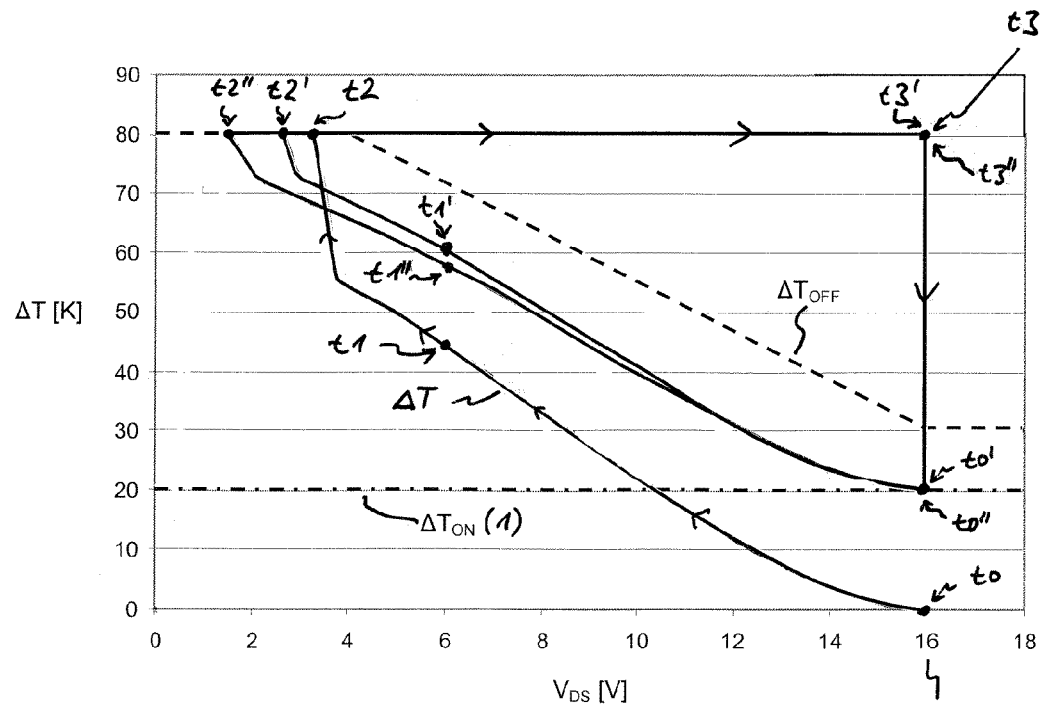
FIG. 3B is a diagram showing some cycles of a curve of the temperature difference between the first temperature and the second temperature, as a function of the voltage difference between the first load terminal and the second load terminal of the power semiconductor switch when switching ON a load.

In the following FIG. 3B, the mode of operation of the arrangement 100 shown in FIG. 1 will be explained, by way of example, for the switching-OFF threshold temperature difference curve $\Delta T_{OFF}$ and the switching-ON threshold temperature difference curve $\Delta T_{ON}(2)$ as explained with reference to FIG. 3A, in combination with a load 7, the resistance of which increases after being supplied with electric power. Examples for such loads 7 are incandescent lamps, inductive loads, e.g., coils, motors, etc. FIG. 3B also shows the temperature difference $\Delta T=T1-T2$ depending on the described voltage drop $V_{DS}$. The arrows along the temperature difference curve $\Delta T$ indicate the progress in time.

In the very first moment after switching the power semiconductor chip 1 of FIG. 1 from the OFF-state to the ON-state (see in FIG. 3B point of time t0) due to the very low resistance of the load 7 most of the supply voltage $V_B$ (in the example about 16 V) drops across the power semiconductor switch 1 between the first load terminal 11 and the second load terminal 12, i.e., the voltage drop $V_{DS}$ is less than but almost equal to the supply voltage $V_B$. Presumed that the power semiconductor switch 1 was, prior to the point of time t0, in the OFF-state long enough to allow for a temperature equalization in the semiconductor chip 1, the first temperature T1 and the second temperature T2 are equal, i.e., the temperature difference $\Delta T=T1-T2$ is zero at t0.

At a later point of time t1, due to an increased resistance of the load 7, the voltage drop $V_{DS}$ is reduced to about 6 V, and the temperature difference $\Delta T=T1-T2$ is about 45 K. In the same way, up to a point of time t2 which is later than the point of time t1, the voltage drop $V_{DS}$ is continuously reduced, whilst the temperature difference $\Delta T=T1-T2$ increases up to about 80 K. In the period between t0 and t2, at any point of time the temperature difference $\Delta T=T1-T2$ is less than the predefined switching-OFF threshold temperature difference $\Delta T_{OFF}$. Therefore, in the period between t0 and t2 the voltage V1 provided by the temperature difference evaluation unit 8 is less than the voltage V2 provided at the output 93 of the first threshold providing unit 9, i.e., the voltage difference V1–V2 is negative and the signal provided at the output 33 of the first comparator unit 3 causes the power semiconductor switch 1, via the interconnected gate driving unit 5, to remain in the ON-state.

However, at the point of time t2, when the voltage drop $V_{DS}$ is about 3 V, the temperature difference $\Delta T=T1-T2$ is equal to the predefined switching-OFF threshold temperature difference $\Delta T_{OFF}$, i.e. the voltages V1 and V2 applied to the respective inputs 31 and 32 of the first comparator unit 3 are equal so that the first comparator unit 3 changes its output signal provided at the output 33 in order to cause the gate driving unit 5 to switch the power semiconductor switch 1 OFF. Hence, the voltage drop $V_{DS}$ increases to about 16 V (see point of time t3). Then, the lamp cools down and the temperature difference $\Delta T$ begins to decrease until at a point of time t0', the temperature difference $\Delta T$ is equal to a predefined switching-ON threshold temperature difference $\Delta T_{ON}$. A first cycle is completed, and, at t0', the power semiconductor switch 1 is switched ON again, a second cycle starts.

With an increasing resistance of the load 7 the voltage drop $V_{DS}$ decreases, thereby passing a point of time t1', until, at a point of time t2', the temperature difference $\Delta T=T1-T2$ and the switching-OFF threshold temperature difference $\Delta T_{OFF}$ are equal and the power semiconductor switch 1 is switched OFF again. The voltage drop $V_{DS}$ increases again to about 16 V (see point of time t3'), the lamp cools down and the temperature difference $\Delta T$ begins to decrease until—at a point of time t0"—the temperature difference $\Delta T$ is equal to the switching-ON threshold temperature difference $\Delta T_{ON}$. The second cycle is completed, and, at t0", the power semiconductor switch 1 is switched ON again, a third cycle starts.

In this way, cycling continues until the temperature difference $\Delta T$ remains constantly lower than the switching-OFF threshold temperature difference $\Delta T_{OFF}$.

In the arrangement of FIG. 1, the predefined switching-ON threshold temperature difference $\Delta T_{ON}$ is represented by a voltage V2', which is generated by a second threshold providing unit 9'. The voltage V1 representing the temperature difference $\Delta T=T1-T2$ and the voltage V2' are fed to respective inputs 41 and 42 of a second comparator unit 4. As long as the voltage V1 provided by the temperature difference evaluation unit 8 is greater than the voltage V2' provided at the output 93' of the second threshold providing unit 9', i.e., as long as the voltage difference V1–V2' is negative, an output signal provided at the output 43 of the second comparator unit 4 causes the power semiconductor switch 1, via the interconnected gate driving unit 5, to remain in the OFF-state.

However, at the point of time t0' the temperature difference $\Delta T=T1-T2$ is equal to the predefined switching-ON threshold temperature difference $\Delta T_{ON}$, i.e., the voltages V1 and V2' applied to the respective inputs 41 and 42 of the second comparator unit 4 are equal so that the comparator unit 4 changes its output signal provided at the output 43 in order to cause the gate driving unit 5 to switch the power semiconductor switch 1 ON.

Due to the switching delay, in particular, of the second comparator unit 4, of the gate driving unit 5 and of the power semiconductor switch 1, the power semiconductor switch 1 is effectively switched ON at a point of time t5 which is later than the point of time t4, i.e., the temperature difference $\Delta T=T1-T2$ decreases in the period between t4 and t5. However, at t5 there the current $I_{DS}$ through the power semiconductor switch 1 and, accordingly, the temperature difference $\Delta T$ begin to increase.

Then, at a point of time t6 the temperature difference ΔT=T1−T2 and the predefined switching-OFF threshold temperature difference ΔT$_{OFF}$ are equal again, i.e., the voltages V1 and V2 applied to the respective inputs 31 and 32 of the first comparator unit 3 are equal so that the first comparator unit 3 changes its output signal provided at the output 33 in order to cause the gate driving unit 5 to switch the power semiconductor switch 1 OFF and the cycle starts anew as described with reference to the period from t2 to t6.

In the previous example, the signals provided by the temperature difference evaluation unit 8, by the first threshold providing unit 9, by the second threshold providing unit 9', by the first comparator unit 3, by the second comparator unit 4, and by the gate driving unit 5 have been described as voltages. However, any other signals, e.g., currents, digital signals including signals exchanged by bus systems, are applicable as well. Moreover, the signals do not necessarily need to have the algebraic sign as described above. Any other sign, if any, is applicable as well.

Figure 2A:
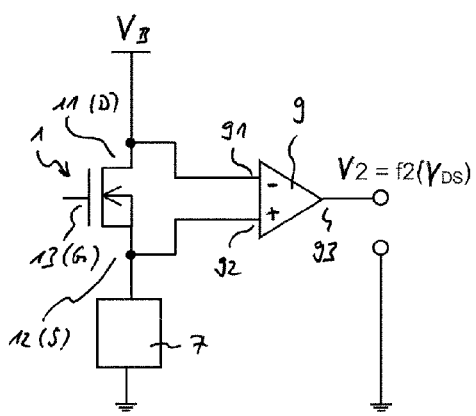
FIG. 2A is a simplified circuit diagram explaining a possible embodiment of a first threshold providing unit as used in the power semiconductor circuit arrangement of FIG. 1.
Figure 2B:
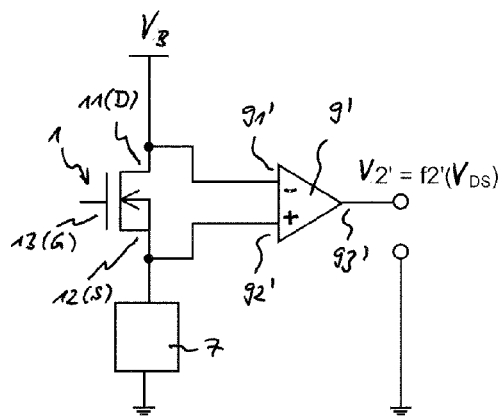
FIG. 2B is a simplified circuit diagram explaining a possible embodiment of a second threshold providing unit as used in the power semiconductor circuit arrangement of FIG. 1.

In FIG. 1, the first threshold providing unit 9 and the second threshold providing unit 9' were described in a simplified manner only. FIGS. 2A and 2B show possibilities how the first threshold providing unit 9 and/or the second threshold providing unit 9', respectively, may be realized. In FIG. 2A, the first threshold providing unit 9 comprises an operational amplifier with an (inverting) first input 91, a second input 92, and an output 93. The first input 91 is connected to the first load terminal 11, the second input 92 to the second load terminal 12, so as to provide an output signal at the output 93 which may be proportional to the voltage difference between the inputs 91 and 92, i.e., to the voltage drop V$_{DS}$. Depending on the requirements of the particular application, a gain factor or an attenuation factor, and/or an offset voltage may be implemented if necessary. In FIG. 2A, an increasing voltage drop V$_{DS}$ results in a decreasing output voltage V2. Generally, the characteristic of the operational amplifier may be linear or non-linear, but not constant. The respective circuitry of the operational amplifier required to achieve the predefined output signal is not shown in FIG. 2A.

As shown in FIG. 2B, the output voltage V2' may be provided by the second threshold providing unit 9' in the same way as the output voltage V2 is provided by the first threshold providing unit 9. The characteristic of the operational amplifier of the second threshold providing unit 9' shown in FIG. 2B may also be linear or non-linear, but also constant. The inputs 91', 92' and the output 93' correspond with the inputs 91, 92 and the output 93, respectively, shown in FIG. 2A. The curve progression of the predefined switching-OFF threshold temperature difference ΔT$_{OFF}$(V$_{DS}$) may be monotonic decreasing with V$_{DS}$, i.e., $$\frac{\partial(\Delta T_{OFF})}{\partial V_{DS}} \leq 0 \qquad (1)$$

Alternatively, the curve progression of the predefined switching-OFF threshold temperature difference ΔT$_{OFF}$(V$_{DS}$) may be strictly monotonic decreasing with V$_{DS}$, i.e., $$\frac{\partial(\Delta T_{OFF})}{\partial V_{DS}} < 0 \qquad (2)$$

The curve progression of the predefined switching-ON threshold temperature difference ΔT$_{ON}$(V$_{DS}$) may be monotonic decreasing with V$_{DS}$, i.e., $$\frac{\partial(\Delta T_{ON})}{\partial V_{DS}} \leq 0 \qquad (3)$$

Alternatively, the curve progression of the predefined switching-ON threshold temperature difference ΔT$_{ON}$(V$_{DS}$) may be strictly monotonic decreasing with V$_{DS}$, i.e., $$\frac{\partial(\Delta T_{ON})}{\partial V_{DS}} < 0 \qquad (4)$$

Further, the predefined switching-ON threshold temperature difference ΔT$_{ON}$ may be defined as constant.

Optionally, the predefined switching-OFF threshold temperature difference ΔT$_{OFF}$(V$_{DS}$) may be defined to be greater than the predefined switching-ON threshold temperature difference ΔT$_{ON}$(V$_{DS}$) at any voltage drop V$_{DS}$.

In cases where the switching delay, in particular, of the first comparator unit 3, of the gate driving unit 5 and of the power semiconductor switch 1 is large, it may also be applicable to define the switching-OFF threshold temperature difference ΔT$_{OFF}$(V$_{DS}$) and the predefined switching-ON threshold temperature difference ΔT$_{ON}$(V$_{DS}$) to be equal for any voltage drop V$_{DS}$. In these cases, only one of the first comparator unit 3 and the second comparator unit 4 is required.

Figure 4:
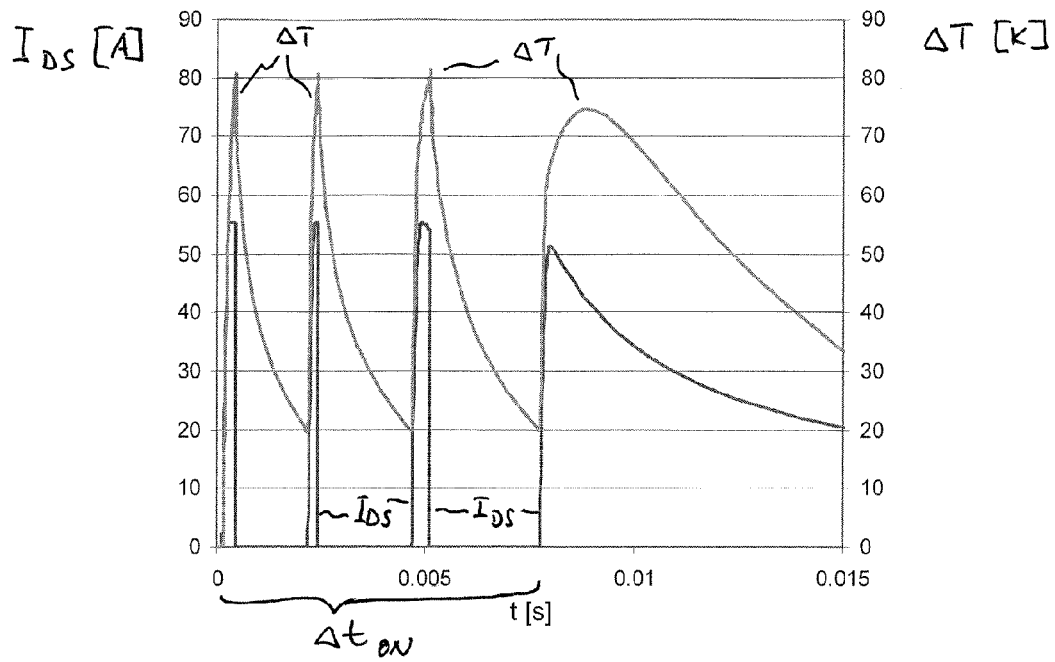
FIG. 4 is a diagram showing the electrical current through the power semiconductor switch, and the temperature difference between the first temperature and the second temperature, as a function of the time t, when switching ON the power semiconductor switch.

FIG. 4 is a diagram showing the electrical current I$_{DS}$ through the power semiconductor switch 1 of FIG. 1, and the temperature difference ΔT=T1−T2 between the first temperature T1 and the second temperature T2, as a function of the time t, when switching ON the power semiconductor switch, wherein the load 7 is an incandescent lamp. The incandescent lamp is intended to be switched on. However, within a turn-on period Δt$_{ON}$, the filament of the lamp is comparatively cold and therefore has a comparatively low resistance which causes the power semiconductor switch 1 to be alternately switched OFF and ON several times as described with reference to FIG. 3B. After a while, if the resistance of the filament is high enough, the temperature difference ΔT decreases and the power semiconductor switch 1 remains in the ON-state continuously.

Figure 5:
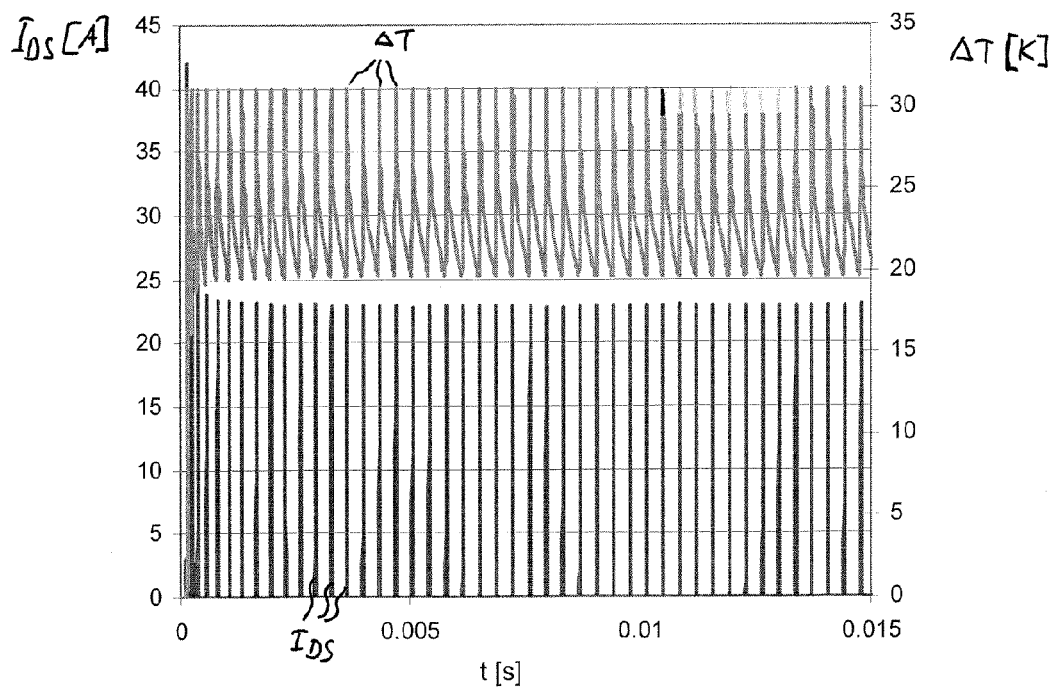
FIG. 5 is a diagram showing the electrical current through the power semiconductor switch, and the temperature difference between the first temperature and the second temperature, as a function of the time t, in the case of an electric short circuit.

FIG. 5 is a diagram showing the electrical current I$_{DS}$ through the power semiconductor switch 1 of FIG. 1, and the temperature difference ΔT=T1−T2 between the first temperature T1 and the second temperature T2, as a function of the time t, in the case of an electric short circuit. During a short circuit, the voltage drop V$_{DS}$ will be almost identical to the supply voltage V$_B$ and the power semiconductor switch 1 is heated to high temperatures T1. Accordingly, the temperature difference ΔT=T1−T2 increases and the power semiconductor switch 1 is switched OFF. After cooling down, the power semiconductor switch 1 is switched ON again. However, due to the short circuit the load 7 is bypassed and does not act as a protective resistor for the power semiconductor switch 1, i.e., alternately switching the power semiconductor switch 1 OFF and ON is continued.

Figure 6:
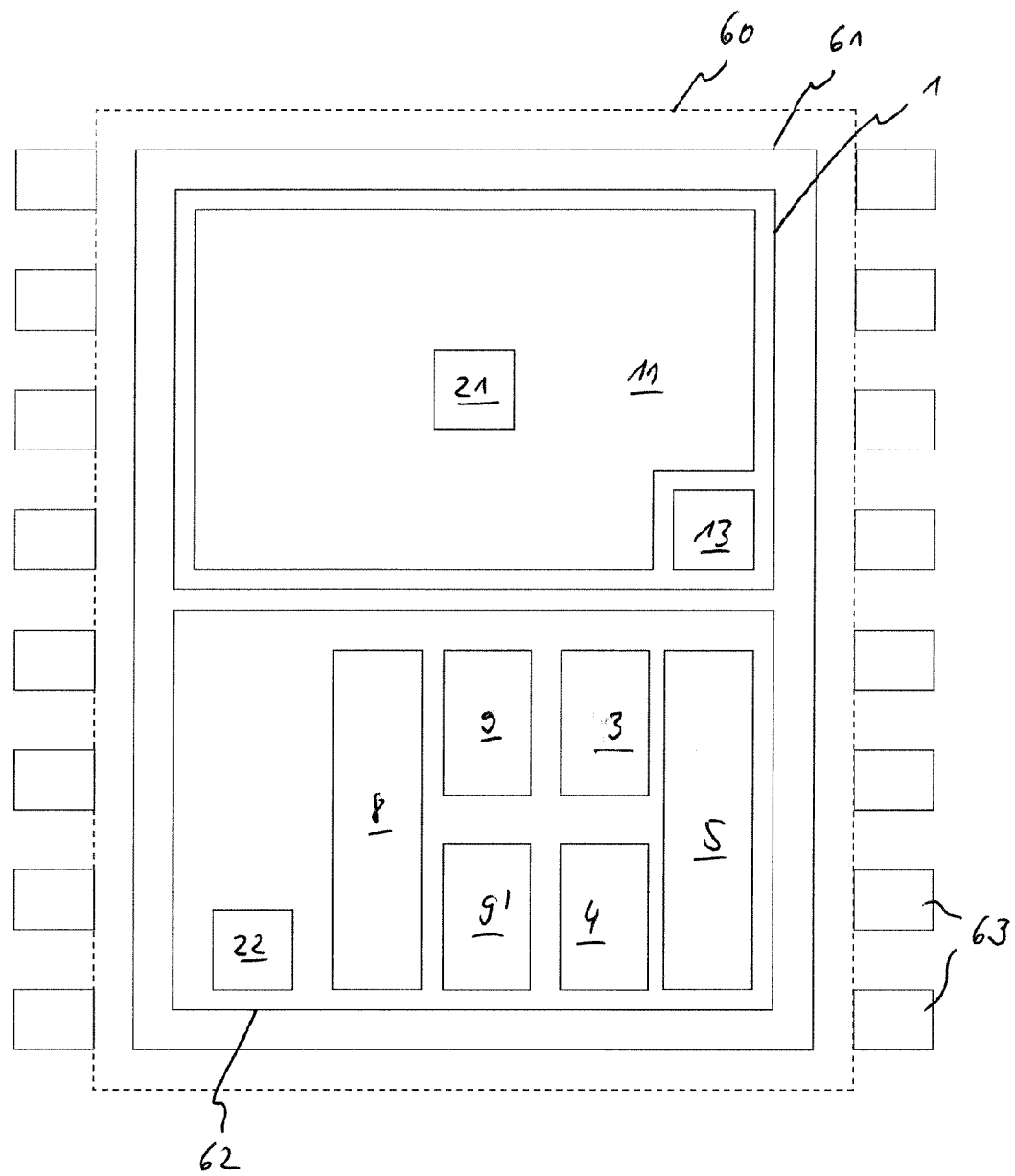
FIG. 6 is top view of power semiconductor chip comprising all components shown in FIG. 1, except the load and the power supply $V_B$.

FIG. 6 is top view of power semiconductor chip 61 comprising all components shown in FIG. 1 except the load 7 and the power supply V$_B$. The power semiconductor chip 61 includes the power semiconductor switch 1 with the first load terminal 11 and the second terminal 13 on top. Additionally, a control circuitry 62 comprising the temperature difference evaluation unit 8, the first and second threshold providing units 9 and 9', respectively, and the first and second comparator units 3 and 4, respectively, is arranged on the power semiconductor chip 61. The first temperature sensor 21 is arranged in the area of the power semiconductor switch 1. The second temperature sensor 22 however is arranged distant from the power semiconductor switch 1 in the area of the control circuitry 62. The power semiconductor chip 61 and the control circuitry 62 including the respective components are arranged in common housing 60 which is indicated as a dashed line. The power semiconductor chip 61 further comprises leads 63. The required electric connections of the arrangement are suppressed in FIG. 6.

Although specific examples have been illustrated and described herein, it will be appreciated by those of ordinary skill in the art that a variety of alternate and/or equivalent implementations may be substituted for the specific examples shown and described without departing from the scope of the present invention. This application is intended to cover any adaptations or variations of the specific examples discussed herein. Therefore, it is intended that this invention be limited only by the claims and the equivalents thereof.

Finally it should be noted that device features or method steps that have been explained in terminal with one example may be combined with device features or method steps of other examples also in those cases in which such combinations have not explicitly been explained. In particular, features or method steps mentioned in a claim may be combined with features or method steps mentioned in any one or more other claims within the same embodiment, as long as the respective features or method steps do not exclude each other.

What is claimed is:

1. A method for operating a power semiconductor circuit arrangement, the method comprising:
   providing a power semiconductor chip comprising a power semiconductor switch with a first load terminal and with a second load terminal;
   providing a first temperature sensor that is thermally coupled to the power semiconductor switch;
   providing a second temperature sensor;
   determining a temperature difference between a first temperature measured by the first temperature sensor and a second temperature measurement by the second temperature sensor, wherein the first temperature and the second temperature are taken at a first time;
   determining a switching-OFF threshold by applying an inconstant first function to a voltage drop over the power semiconductor switch between the first load terminal and the second load terminal;
   comparing the determined temperature difference to the switching-OFF threshold; and
   switching OFF the power semiconductor switch or keeping the power semiconductor switch switched OFF if the temperature difference is greater than or equal to the switching-OFF threshold.

2. The method of claim 1, further comprising:
   determining a switching-ON threshold by applying second function to the voltage drop over the power semiconductor switch between the first load terminal and the second load terminal;
   comparing the determined temperature difference to the switching-ON threshold; and
   switching ON the power semiconductor switch or keeping the power semiconductor switch switched ON if the temperature difference is less than or equal to the switching-ON threshold.

3. The method of claim 2, wherein the second function is inconstant.

4. The method of claim 3, wherein the switching-OFF threshold is greater than the switching-ON threshold at any voltage drop.

5. The method of claim 2, wherein the second function is constant.

6. The method of claim 1, wherein the temperature difference is represented by a first voltage, and wherein the switching-OFF threshold is represented by a second voltage.

7. The method of claim 6, wherein the first voltage and the second voltage are fed to a comparator that keeps the power semiconductor switch switched OFF if the first voltage is greater than or equal to the second voltage.

8. The method of claim 1, wherein the power semiconductor chip, the first temperature sensor and the second temperature sensor are integrated in a common housing.

9. The method of claim 8, wherein the first temperature sensor and the second temperature sensor are integrated in the power semiconductor chip.

10. A power semiconductor circuit arrangement comprising:
    a power semiconductor chip comprising a power semiconductor switch with a first load terminal and with a second load terminal;
    a first temperature sensor that is thermally coupled to the power semiconductor switch;
    a second temperature sensor; and
    an electrical circuit configured to
       determine a temperature difference between a first temperature measured by the first temperature sensor and a second temperature measurement by the second temperature sensor taken at a first time,
       determine a switching-OFF threshold by applying an inconstant first function to a voltage drop over the power semiconductor switch between the first load terminal and the second load terminal,
       compare the determined temperature difference to the switching-OFF threshold, and
       switch OFF the power semiconductor switch or to keep the power semiconductor switch switched OFF if the temperature difference is greater than or equal to the switching-OFF threshold.

11. The power semiconductor circuit arrangement of claim 10, wherein
    the electrical circuit is configured to
       determining a switching-ON threshold by applying second function to the voltage drop over the power semiconductor switch between the first load terminal and the second load terminal,
       comparing the determined temperature difference to the switching-ON threshold, and
       switch ON the power semiconductor switch or to keep the power semiconductor switch switched ON if the temperature difference is less than or equal to the switching-ON threshold.

12. The power semiconductor circuit arrangement of claim 11, wherein the second function is inconstant.

13. The power semiconductor circuit arrangement of claim 12, wherein the switching-OFF threshold is greater than the switching-ON threshold at any voltage drop.

14. The power semiconductor circuit arrangement of claim 11, wherein the second function is constant.

15. The power semiconductor circuit arrangement of claim 10, wherein the temperature difference between the first temperature and the second temperature is represented by a first voltage, and wherein an actual switching-OFF threshold is represented by a second voltage.

16. The power semiconductor circuit arrangement of claim 15, comprising a comparator with a first input and with a second input, wherein the first voltage is supplied to the first input, the second voltage is supplied to the second input, and wherein the comparator is designed to switch OFF the power semiconductor switch or to keep the power semiconductor switch switched OFF, if the first voltage is greater than or equal to the second voltage.

17. The power semiconductor circuit arrangement of claim 10, wherein the power semiconductor chip, the first temperature sensor and the second temperature sensor are integrated in a common housing.

18. The power semiconductor circuit arrangement of claim 17, wherein the first temperature sensor and the second temperature sensor are integrated in the power semiconductor chip.

19. The power semiconductor circuit arrangement of claim 10, comprising an incandescent lamp that is electrically connected to the first load terminal or to the second load terminal.

20. The power semiconductor circuit arrangement of claim 19, wherein the incandescent lamp is a lamp of a vehicle.

21. The power semiconductor circuit arrangement of claim 10, wherein the power semiconductor switch is a DMOS transistor.

22. A power semiconductor circuit arrangement comprising:
- a power semiconductor switch with a first load terminal, a second load terminal and a control input;
- a first temperature sensor thermally coupled to the power semiconductor switch;
- a second temperature sensor;
- a temperature difference evaluation unit which is designed to provide a first voltage at a first output, the first voltage representing a temperature difference between a temperature of the first temperature sensor and a temperature of the second temperature sensor;
- a threshold providing unit to provide a second voltage at a second output, the second voltage representing a switching-OFF threshold temperature difference from an inconstant first function applied to a voltage difference measured between the first load terminal and the second load terminal, wherein the first function is a switching-OFF threshold temperature difference depending on a voltage drop;
- a comparator unit comprising a first comparator input, a second comparator input, and a comparator output, wherein the first output is electrically connected to the first comparator input, wherein the second output is electrically connected to the second comparator input, and wherein the comparator output is electrically connected to the control input of the power semiconductor switch; and
- wherein the comparator unit is designed to provide a signal causing the power semiconductor switch to remain or to be switched in an OFF-state, if the voltage difference between the first voltage and the second voltage implies that a temperature difference determined by the temperature difference evaluation unit is greater than or equal to a switching-OFF threshold temperature difference determined by the threshold providing unit.

23. The power semiconductor circuit arrangement of claim 22, further comprising a gate driving unit with an input and with an output, wherein the comparator output is electrically connected to the input of the gate driving unit, and wherein the output of the gate driving unit is electrically connected to the control input of the power semiconductor switch.

24. The power semiconductor circuit arrangement of claim 22, wherein the threshold providing unit is designed as an analog circuit.

25. The power semiconductor circuit arrangement of claim 22, wherein a predefined switching-OFF threshold temperature difference is monotonic decreasing with the voltage difference measured between the first load terminal and the second load terminal.

26. The power semiconductor circuit arrangement of claim 22, further comprising:
- a further threshold providing unit to provide a third voltage at a third output, the third voltage representing a switching-ON threshold temperature difference from a second function applied to a voltage difference measured between the first load terminal and the second load terminal, wherein the second function is a switching-ON threshold temperature difference depending on a voltage drop;
- a further comparator unit comprising a third comparator input, a fourth comparator input, and a further comparator output, wherein the first output is electrically connected to the third comparator input, wherein the third output is electrically connected to the fourth comparator input, and wherein the comparator output is electrically connected to a further control input of the power semiconductor switch; and
- wherein the further comparator unit is designed to provide a signal causing the power semiconductor switch to remain or to be switched in an ON-state, if the voltage difference between the first voltage and the second voltage implies that a temperature difference determined by the temperature difference evaluation unit is less than or equal to a switching-ON threshold temperature difference determined by the further threshold providing unit.

\* \* \* \* \*